United States Patent [19]
Oishi

[11] Patent Number: 5,910,843
[45] Date of Patent: Jun. 8, 1999

[54] POSITIONING APPARATUS AND METHOD THEREOF, AND EXPOSURE APPARATUS

[75] Inventor: Satoru Oishi, Utsunomiya, Japan

[73] Assignee: Canon Kabushiki Kaisha, Tokyo, Japan

[21] Appl. No.: 08/774,881

[22] Filed: Dec. 27, 1996

[30] Foreign Application Priority Data

Jan. 4, 1996 [JP] Japan .................................. 8-014776
Feb. 27, 1996 [JP] Japan .................................. 8-065510

[51] Int. Cl.⁶ .................................................. G01B 11/14
[52] U.S. Cl. ...................... 356/375; 356/373; 356/401; 356/399; 250/548; 250/561; 250/557; 250/491
[58] Field of Search .................................... 356/375, 373, 356/401, 399; 250/548, 561, 557, 491

[56] References Cited

U.S. PATENT DOCUMENTS

| | | | |
|---|---|---|---|
| 4,780,617 | 10/1988 | Umatate et al. | 250/548 |
| 4,971,444 | 11/1990 | Kato | 356/375 |
| 5,153,678 | 10/1992 | Ota | 356/401 |
| 5,543,921 | 8/1996 | Uzawa et al. . | |

FOREIGN PATENT DOCUMENTS 1-207604  8/1989  Japan .
2-001506  1/1990  Japan .

*Primary Examiner*—Frank G. Font
*Assistant Examiner*—Reginald A. Ratliff
*Attorney, Agent, or Firm*—Fitzpatrick, Cella, Harper & Scinto

[57] ABSTRACT

A positioning apparatus and a method which enables precise positioning of a mask and a wafer without being influenced by the deviation of the gap between the mask and wafer or the positional deviation of the irradiated light beam. A light beam irradiates on a first mark of a first object and a second mark of a second object. The relative position of the two objects is detected on the basis of a plurality of spot images of the light beam transmitting through the two marks, or being reflected upon or diffracted upon the marks. Each centroid of the plurality of spots is detected and a first alignment amount is obtained; in addition, a correction amount for the first alignment is obtained by applying the fuzzy inference method based on an additional signal, such as the positional relation of the first and second objects or the positional relation of the irradiated light beam and the first mark.

15 Claims, 7 Drawing Sheets

POSITIONING APPARATUS AND METHOD THEREOF, AND EXPOSURE APPARATUS

BACKGROUND OF THE INVENTION

The present invention relates to a positioning apparatus and method thereof, and an exposure apparatus including the positioning apparatus, and more particularly, to a positioning apparatus which positions a wafer and a mask, and an exposure apparatus including the positioning apparatus.

In the manufacturing process of semiconductor devices such as an IC or an LSI or the like, multiple layers are stacked to form a complete semiconductive device. A pattern to be exposed to a photoresist for forming each of the layers is normally formed on a mask. In order to position each of the layers with high precision, a pattern to be used for forming a next layer must be precisely positioned with a resultant product manufactured in a former process.

Various methods have been suggested as a method for the above described positioning. FIG. 6 shows a positioning method employing two gratings and a detailed description thereof is disclosed in Japanese Patent Application Laid-Open (KOKAI) No. 2-1506.

In the method disclosed in KOKAI No. 2-1506, grating patterns 601 and 602 are established respectively on a mask 603 and a wafer 604 arranged adjacent to each other in an exposure apparatus. A semiconductor laser 606 irradiates the grating pattern 601 with light beam 601. The light beam 607 irradiated by the semiconductor laser 606 is subjected to different diffraction by the two grating patterns 601 and 602, forming two spots on a line sensor 605. Herein, 1 denotes a 1st diffraction and 0 denotes a 0th diffraction, and the diffraction at the time the light beam passing through the mask, the wafer, and the mask is expressed by using these figures. There are two light paths: a light path of 110 diffraction and a light path of 011 diffraction. Because of the presence of these two light paths, the aforementioned two spots are formed. In the above method, the relative amount of position deviation between the mask 603 and wafer 604 is obtained on the basis of the difference in the centroid of the two spots, and positioning is performed in accordance with the amount of position deviation.

However, in the conventional method of positioning shown in FIG. 6, if the gap G between the mask 603 and wafer 604 changes, the centroid of the spot formed on the line sensor 605, which serves as an alignment sensor would change; resulting in deteriorated precision in measuring the relative amount of position deviation between the mask 603 and wafer 604. The deteriorated precision in measurement causes imprecise positioning.

The change in gap G depends upon the precision of a driving apparatus, which adjusts the gap. Moreover, the precision in measurement depends upon mechanical preciseness of an alignment head which detects the centroid of the spot, and the difference in magnification or interference related to two diffraction, the 110 diffraction and 011 diffraction, each forming a respective spot. Furthermore, in a case where the position of a beam irradiating the mask 603 changes relative to the mask 603, the centroid of the spot would also change, resulting in deteriorated precision in measurement of a relative amount of position deviation between the mask 603 and wafer 604.

Due to a complicated physical phenomena in an optical system, the above described factors e.g. the deviation of the gap G, a position deviation of the light beam, and the like, non-linearly influence the precision in measuring the relative amount of position deviation between the mask 603 and wafer 604, thus it is difficult to obtain a correction amount to cancel the influence.

With respect to a method of correcting the amount of alignment, Japanese Patent Application Laid-Open (KOKAI) No. 1-207604 suggests a method utilizing fuzzy inference. FIG. 7 shows the principle of correction utilizing the method. In this method, the amount of correction $\Delta AA$ is obtained by adding a correction amount $\Delta AA1$, calculated on the basis of a deviation $\Delta G$ of the gap G between the mask 603 and wafer 604, and a correction amount $\Delta AA2$, calculated on the basis of a relative amount (M/P) of a position deviation of the light beam irradiating upon the mask 604.

However, generally the correction amounts for each $\Delta G$ and M/P cannot be individually treated, and the influence caused by both amounts interfere with each other. Because of this reason, it is difficult to improve precision of alignment by correcting the amount of alignment, utilizing such simple a equation shown in FIG. 7.

SUMMARY OF THE INVENTION

The present invention has been made in consideration of the above situation, and has as its object to provide a positioning apparatus and method thereof which can position the first and second objects with high precision without being influenced by the relative deviation between the first object and the second object, or a deviation of a light-beam irradiated position where positions of the first and second objects are measured.

In order to attain the foregoing objects, the present invention provides a positioning apparatus for positioning a first object having a first mark and a second object having a second mark located below the first object, by irradiating the first mark with a light beam and detecting the relative position of the first and second objects on the basis of a spot image of the light beam, formed by the light beam being transmitted through the first mark, or reflected or diffracted upon the first and second marks, comprising: means for detecting a position of the spot image and obtaining an alignment amount on the basis of the position; input means for inputting a plurality of data related to the first and second objects and the light beam; determination means for determining to which of a plurality of groups each of the data belongs, wherein the groups are categorized by a content of data, and for determining a correction amount of the alignment amount on the basis of the group to which each of the data belongs; and control means for controlling positioning of the first and second objects utilizing the alignment amount in which the correction amount has been corrected.

In order to attain the foregoing objects, the present invention is characterized in that a grade of belonging to a related group is obtained for each of the data, and the correction amount is determined on the basis of the grade.

Moreover, the present invention is characterized in that the determination means determines the correction amount in accordance with a function where a value determined by the group to which each of the data belongs and the alignment amount are set as variables.

Furthermore, the present invention is characterized in that the plurality of data includes information associated with a relative positional relation between the first object and the second object, and information associated with a relative positional relation between the light beam and the first mark.

Furthermore, the present invention is characterized in that the first object is a mask and the second object is a wafer.

Further, the present invention is characterized in that the plurality of data includes information associated with a semiconductor process performed on the second object, which is a wafer.

Still further, the present invention is characterized in that the first and second marks are gratings.

Moreover, in order to attain the foregoing objects, the present invention provides an exposure apparatus including the positioning apparatus which has the aforementioned characteristics.

Furthermore, in order to attain the foregoing objects, the present invention provides a positioning method of positioning a first object having a first mark and a second object having a second mark located below the first object, by irradiating the first mark with a light beam and detecting the relative position of the first and second objects on the basis of a spot image of the light beam, formed by the light beam being transmitted through the first mark, or reflected or diffracted upon the first and second marks, comprising: a step of detecting a position of the spot image and obtaining an alignment amount on the basis of the position; an input step of inputting a plurality of data related to the first and second objects and the light beam; a determination step of determining to which of a plurality of groups each of the data belongs, wherein the groups are categorized by the content of the data, and determining a correction amount of the alignment amount on the basis of the group to which each of the data belongs; and a control step of controlling positioning of the first and second objects utilizing the alignment amount in which the correction amount has been corrected.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Preferred embodiments of the present invention will be described in detail in accordance with the accompanying drawings.

In the present invention, instead of separating the calculation for correcting the deviation ΔG of a gap G between a mask and a wafer, and the calculation for correcting the relative amount M/P of the positional deviation of a light beam irradiating the mask, correction calculation is performed by functions using the deviation ΔG and the relative position deviation M/P as parameters, thereby realizing alignment with high precision.

Figure 9:
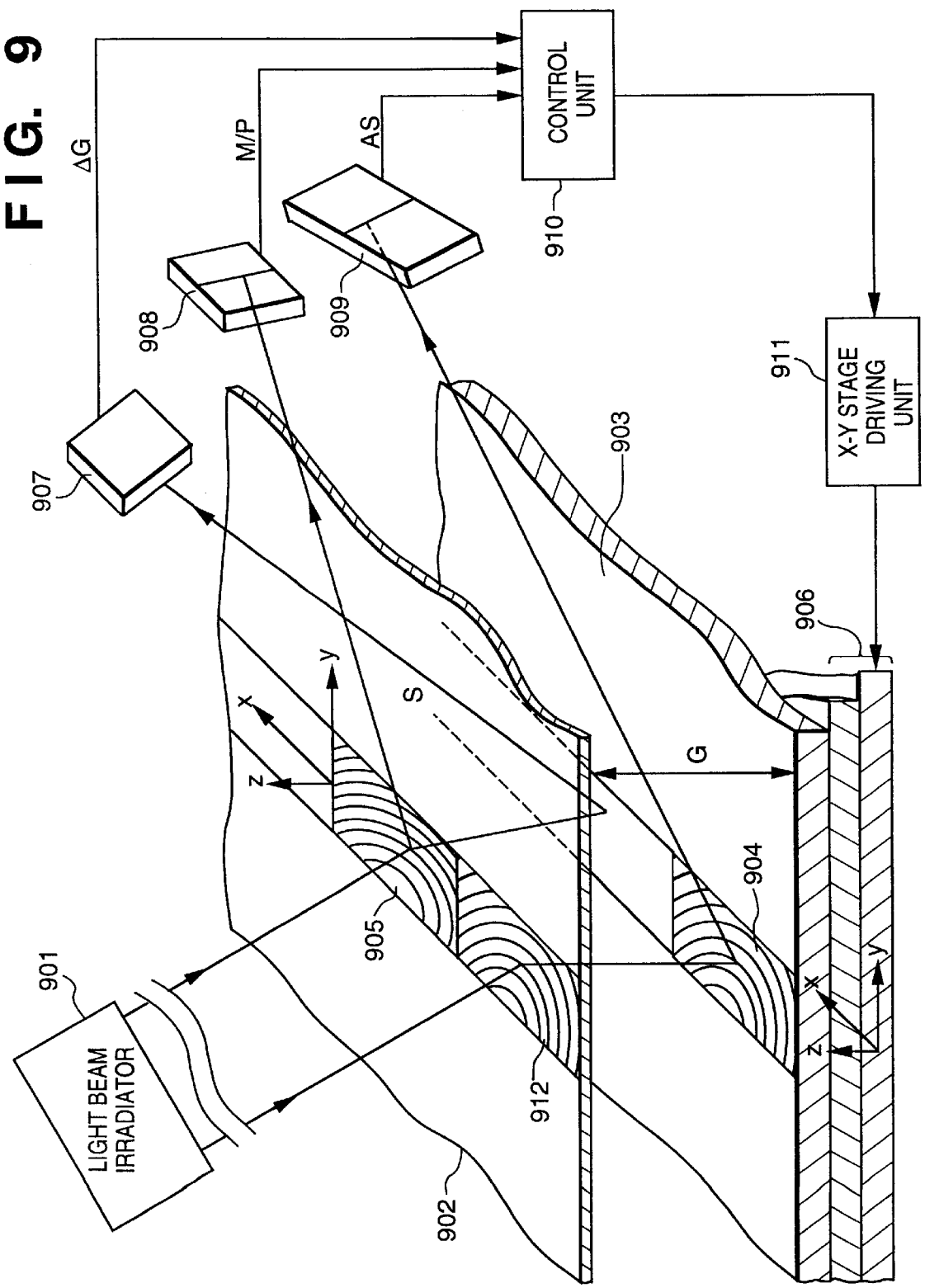
FIG. 9 is a drawing illustrating an exposure apparatus according to the present invention.

FIG. 9 shows a general structure of a positioning apparatus included in an exposure apparatus according to the present invention. A wafer 903 subjected to exposure is placed on an XY stage 906 which is driven by an XY stage driving unit 911, and above the wafer 903, a mask 902 is supported by a supporting member (not shown). Exposure processing is performed each time the positioning of the mask 902 and wafer 903 is completed, by irradiating with an exposure lamp (not shown).

A mechanism related to positioning the wafer and mask will be described next. First, a light beam irradiates an AA mark 912, that is, a grating pattern for detecting a position deviation between the mask and wafer on XY coordinates, on the mask 902. One of the diffracted light beam, from the AA mark 912 on the mask 902, is incident upon an AA mark 904 on the wafer 903, and one of the diffracted light beam from the AA mark 904 is incident upon an AA sensor 909. The AA sensor 909 converts the incident light beam into an alignment signal AS (electric signal) and supplies it to a control unit 910. Note that the AA sensor 909 is a sensor where photoelectric conversion devices are arranged in line, and an output from each of the photoelectric conversion devices is the alignment signal AS.

The position in which the light beam is incident upon the AA sensor 909 changes in accordance with the position deviation of the mask 902 and wafer 903 in the XY coordinates. Although FIG. 9 only shows the mechanism for detecting the position deviation along the X axis, the detection mechanism for the Y axis is also included.

The light beam irradiator 901 also irradiates the light beam on an M/P-ΔG mark 905, that is, a grating pattern for detecting ΔG and M/P, on the mask 902. One of the diffracted light beam from the M/P-ΔG mark 905 on the mask 902 is incident upon the wafer 903, reflected on the wafer 903 and further is incident upon a ΔG sensor 907. The position in which the light beam is incident upon the ΔG sensor 907 changes in accordance with the gap G between the mask 902 and wafer 903 in the Z direction. The ΔG sensor 907 generates a ΔG signal (electric signal) indicative of an deviation ΔG of the gap G on the basis of the incident light beam, and supplies it to the control unit 910.

Another diffracted light beam from the M/P-ΔG mark 905 on the mask 902 is incident upon the M/P sensor 908. The intensity of the light beam incident upon the M/P sensor 908 varies in accordance with the positional relationship between the mask 902 and the light beam irradiator 901 (light beam irradiated from the beam irradiator). The M/P sensor 908 generates an M/P signal indicative of the relative positional deviation between the mask 902 and the beam irradiator 901, in accordance with the intensity of the incident light beam, and supplies it to the control unit 910.

The control unit 910 determines the amount of alignment to be supplied to the XY stage driving unit 911, on the basis of the alignment signal AS supplied from the AA sensor 909, ΔG signal supplied from the ΔG sensor 907 and the M/P signal supplied from the M/P sensor 908.

The XY stage driving unit 911 drives the XY stage 906 according to the alignment amount, and adjusts the positional relationship between the mask 902 and the wafer 903.

Figure 1:
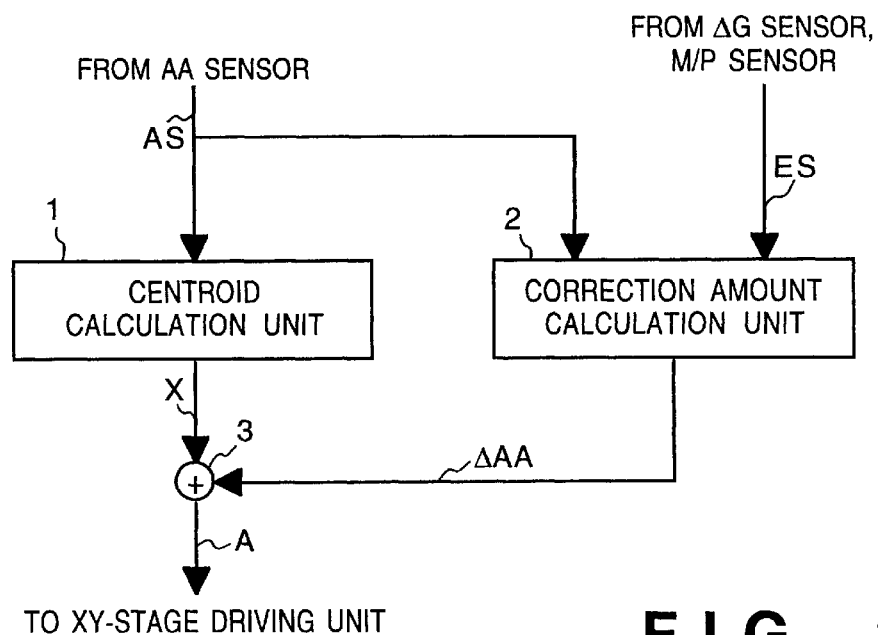
FIG. 1 is a block diagram showing a general arrangement of a positioning apparatus according to the present invention.

FIG. 1 is a conceptualized diagram of a control unit of the positioning apparatus according to the present invention. An alignment signal AS shown in FIG. 9 is inputted to a centroid calculation unit 1 and a correction amount calculation unit 2. The centroid calculation unit 1 calculates the centroid of a spot formed on the AA sensor 909, and calculates a first alignment amount x according to the centroid. More specifically, the centroid calculation unit 1 calculates the intensity distribution of the incident light beam on the basis of an output signal, which constitutes the alignment signal AS, from each of the photoelectric conversion devices, and the centroid of the incident light beam is obtained based on the intensity distribution.

In the correction amount calculation unit 2, a correction amount ΔAA is calculated on the basis of the alignment signal AS and an additional signal ES (e.g. ΔG signal and M/P signal). An add unit 3 adds the correction amount ΔAA to a first alignment amount x and obtains a second alignment amount A. The second alignment amount A is supplied to an XY stage driving unit 911 shown in FIG. 9.

Figure 2:
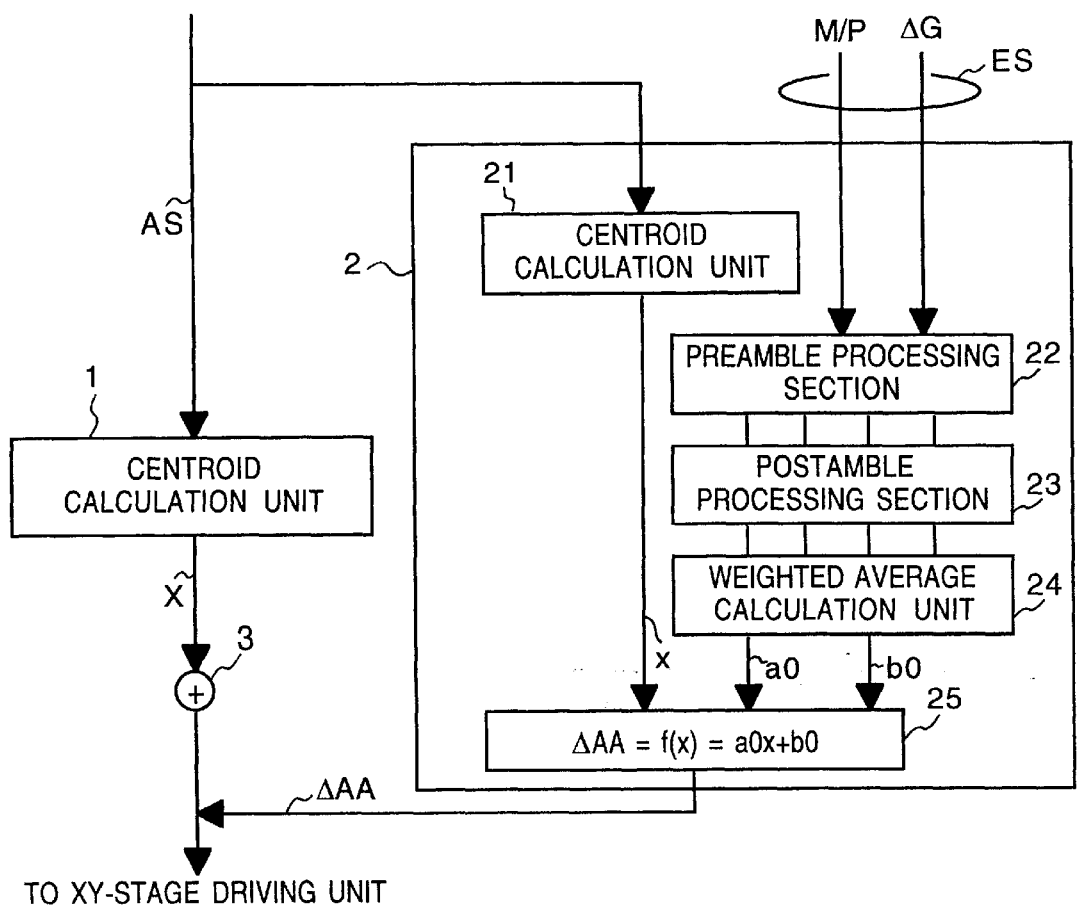
FIG. 2 is a block diagram showing as an example a detailed arrangement of a control unit of the positioning apparatus according to the present invention.

FIG. 2 shows an example of a detailed arrangement of a control unit of the positioning apparatus shown in FIG. 1. In the present embodiment, as an additional signal ES, a deviation ΔG of the gap G between the mask 902 and wafer 903, and the relative positional deviation M/P of the light beam irradiator 901 (light beam irradiated from the beam irradiator) on the AA mark of the mask 902 are inputted. Then the correction amount ΔAA is calculated by fuzzy inference in accordance with the deviation ΔG of the gap G and the relative position deviation M/P, thereby correcting the first alignment amount x. The correction amount ΔAA is expressed by the first function using the first alignment amount x:

$$\Delta AA = a0x + b0$$

where a0 denotes a gain and b0 denotes an offset value. Values for a0 and b0 are determined by the following method.

In the fuzzy inference method, a correction rule is determined based on an empirical rule. The characteristics of a deviation amount from the first alignment amount x, that is, the correction amount ΔAA which is obtained on the basis of the conventional analysis, is qualitatively understood in association with the change of ΔG and M/P. Herein, for instance, the empirical rule is expressed as follows:

if ΔG=NB, M/P=NB then a=a1, b=b1

The portion "ΔG=NB, M/P=NB" following "if" describes a condition related to the deviation ΔG of the gap G and a relative position deviation M/P between the mask and light beam, and is referred to as a "preamble." The portion "a=a1, b=b1" following "then" determines a coefficient based on the preamble and is called "postamble." In the preamble, descriptions such as "PB," "ZE" are also used in addition to "NB." "PB" denotes a membership function implying that the additional signal is a positive value and the value is quite large. "ZE" denotes a membership function implying that the additional signal is close to 0; and "NB" denotes a membership function implying that the additional signal is a negative value and its absolute value is quite large.

On the basis of the foregoing rule, nine empirical rule are expressed as follows.

(1) if ΔG=NB, M/P=NB then a=a1, b=b1
(2) if ΔG=NB, M/P=ZE then a=a2, b=b2
(3) if ΔG=NB, M/P=PB then a=a3, b=b3
(4) if ΔG=ZE, M/P=NB then a=a4, b=b4
(5) if ΔG=ZE, M/P=ZE then a=a5, b=b5
(6) if ΔG=ZE, M/P=PB then a=a6, b=b6
(7) if ΔG=PB, M/P=NB then a=a7, b=b7
(8) if ΔG=PB, M/P=ZE then a=a8, b=b8
(9) if ΔG=PB, M/P=PB then a=a9, b=b9

Figure 3A:
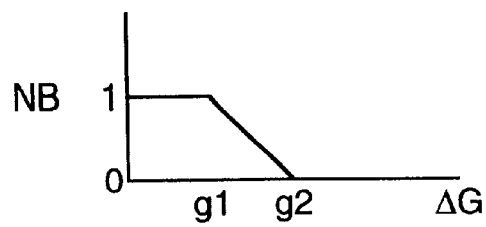
FIGS. 3A, 3B and 3C are graphs showing a membership function related to the deviation ΔG of a gap G.
Figure 3B:
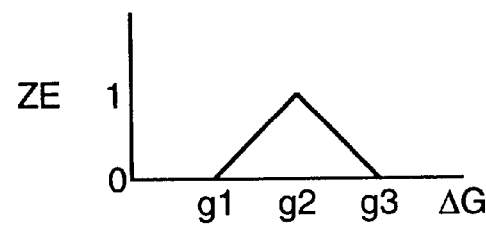
Figure 3C:
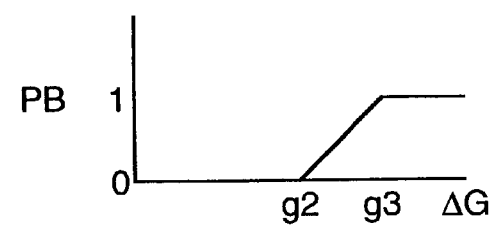

The correction amount calculation unit 2 shown in FIG. 2 stores membership functions related to ΔG and membership functions related to M/P. FIGS. 3A to 3C show membership functions related to ΔG stored in the correction amount calculation unit 2, and FIGS. 4A to 4C show membership functions related to M/P stored in the correction amount calculation unit 2.

Next, descriptions will be provided on the membership function with reference to FIG. 3. In FIG. 3, the horizontal axis expresses a value ΔG, which is a positional deviation from a predetermined value of the gap G between the mask 902 and wafer 903, and the vertical axis expresses the grade of membership utilized in a fuzzy set. The grade is expressed by any values between 0 and 1. Functions having such characteristics are called membership functions. Values which determine boundaries in the grade of ΔG are g1, g2 and g3 (g1<g2<g3). FIGS. 3A, 3B and 3C respectively show membership functions for "ΔG=NB," "ΔG=ZE" and "ΔG=PB".

Figure 4A:
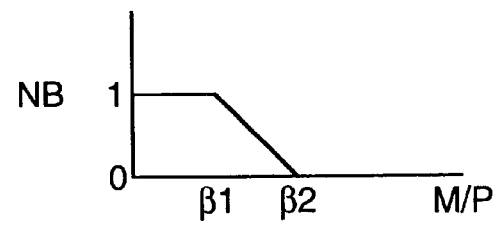
FIGS. 4A, 4B and 4C are graphs showing a membership function related to the relative positional deviation of a light beam irradiating AA mark a a mask.
Figure 4B:
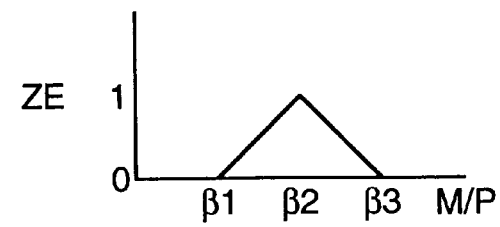
Figure 4C:
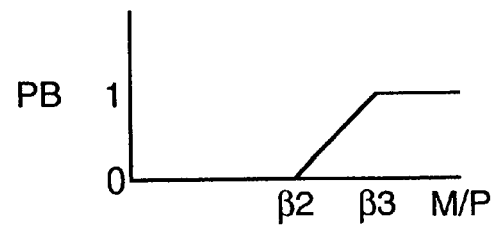

Similarly, in FIG. 4, values which determine boundaries in the grade of M/P are β1, β2 and β3 (β1<β2 <β3). FIGS. 4A, 4B and 4C respectively show membership functions for "M/P=NB," "M/P=ZE" and "M/P=PB".

Also, a1 to a9 and b1 to b9 in the postamble are stored in the correction amount calculation unit 2. Note that a1 to a9 and b1 to b9 are determined based on actual measurement.

Figure 5:
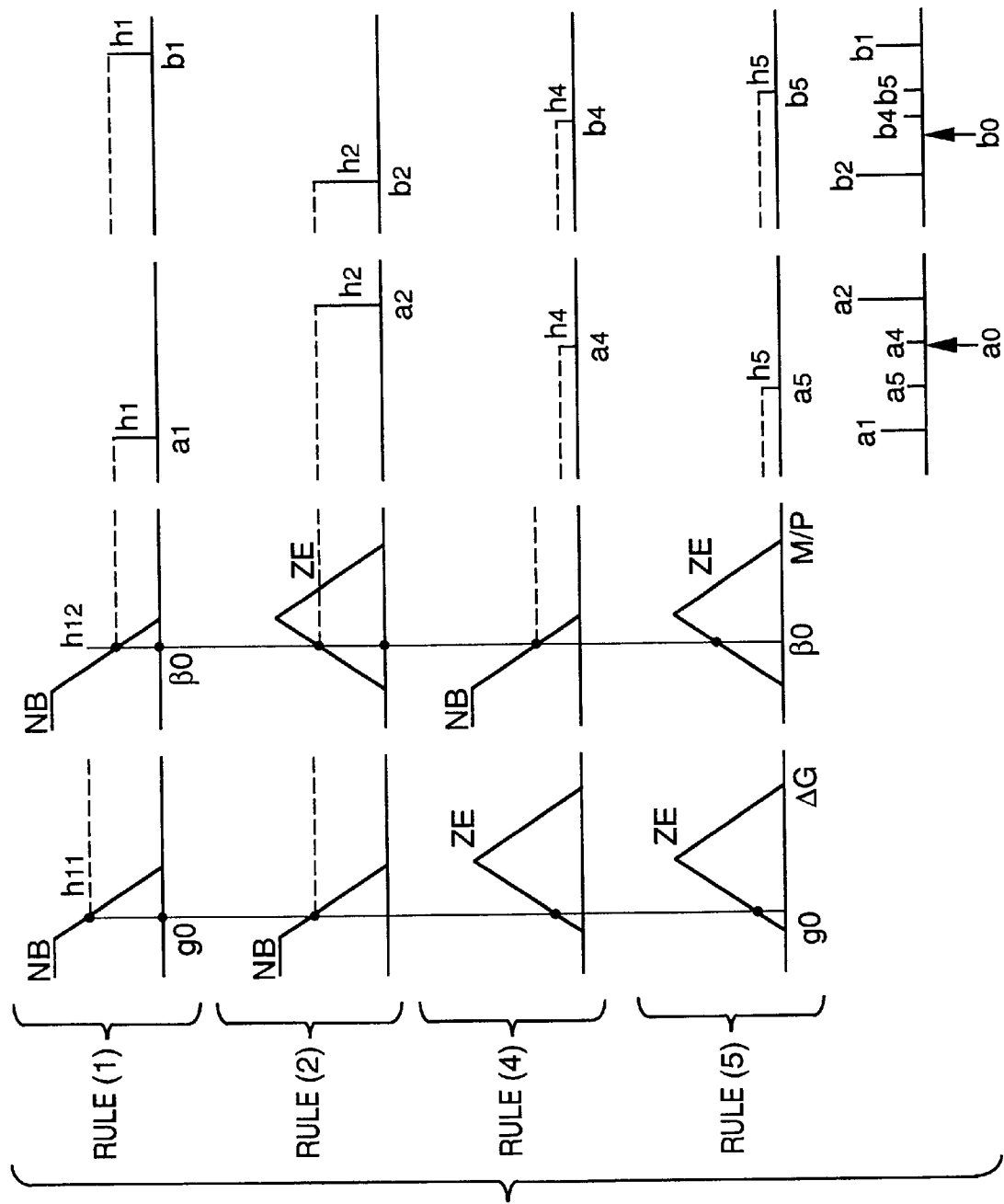
FIG. 5 is an explanatory view for describing a fuzzy inference method according to a present embodiment.
Figure 6:
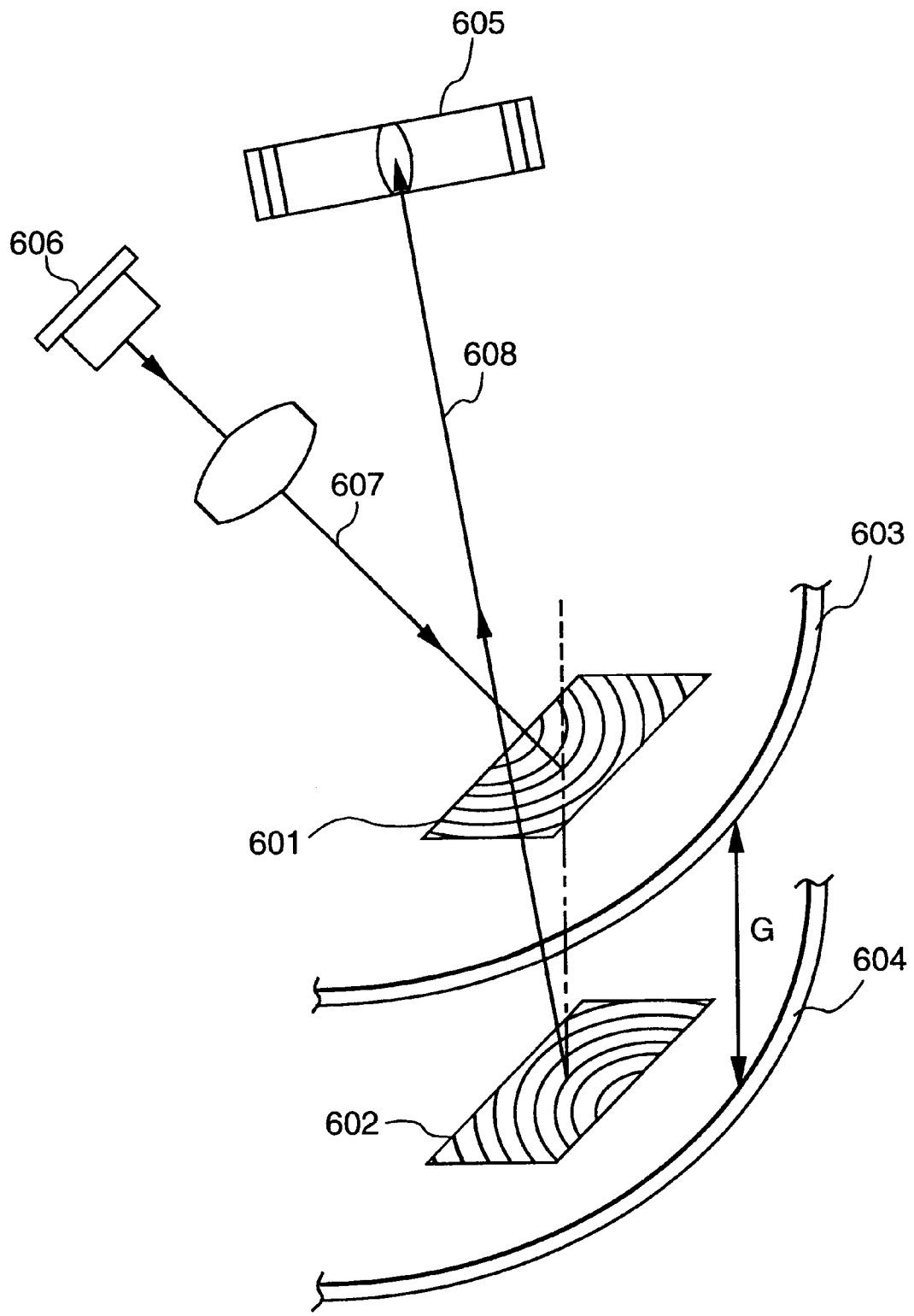
FIG. 6 is a structural view of a conventional alignment system.
Figure 7:
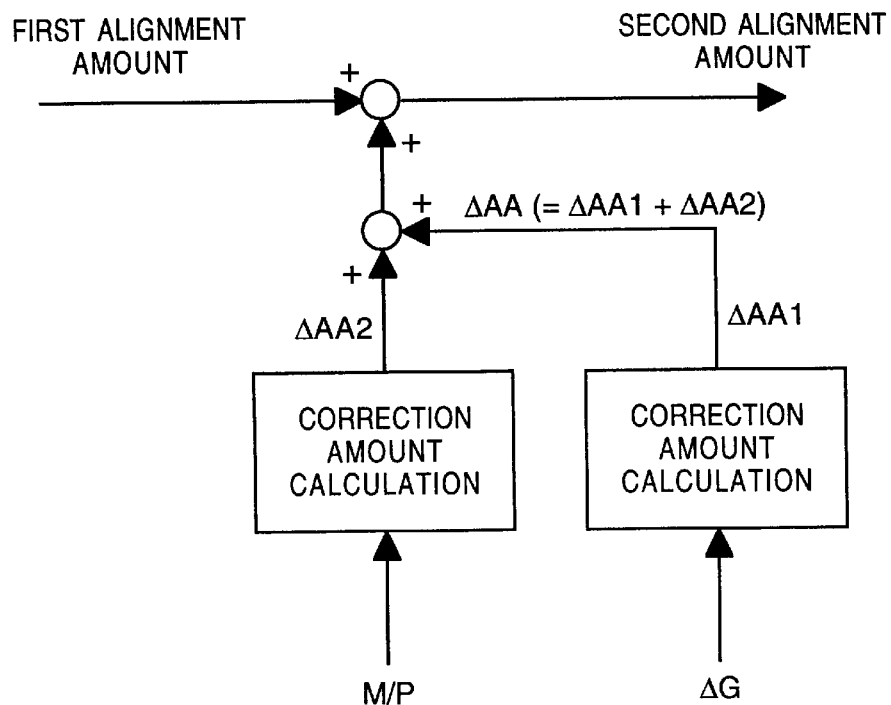
FIG. 7 is a diagram illustrating a conventional correction amount calculation unit.
Figure 8:
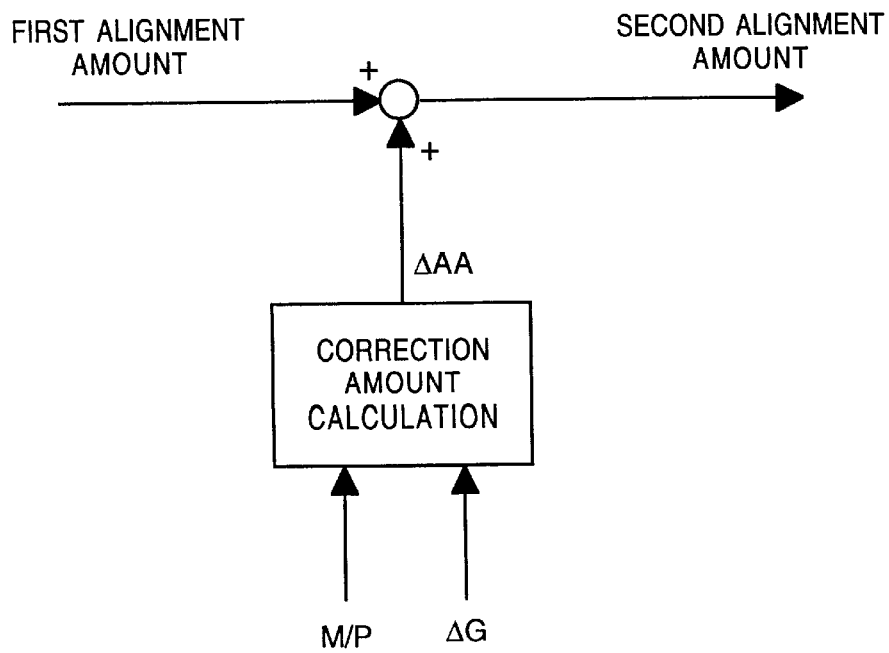
FIG. 8 is a diagram illustrating a correction amount calculation unit according to the present invention.

Next, detailed processing in the correction amount calculation unit 2 will be described. FIG. 5 is an explanatory view for explaining a method of fuzzy inference performed by the correction amount calculation unit 2 in the case where ΔG is g0 (g1<g0<g2) and M/P is β0 (β1<β0<β2)

Assuming that ΔG=g0 and M/P=β0, a case where the membership function holds some value is the cases of FIGS. 3A, 3B, 4A and 4B. Accordingly, the aforementioned rules (1), (2), (4) and (5) are applied, that is:

(1) if ΔG=NB, M/P=NB then a=a1, b=b1
(2) if ΔG=NB, M/P=ZE then a=a2, b=b2
(4) if ΔG=ZE, M/P=NB then a=a4, b=b4
(5) if ΔG=ZE, M/P=ZE then a=a5, b=b5

FIG. 5 shows each of Rules (1), (2), (4) and (5). A process associated with the rule (1) will be described with reference to a Rule (1) in FIG. 5. The grade of ΔG=g0 belonging to "NB" is expressed by a value of the membership function corresponding to ΔG=g0 shown in FIG. 3A; in the case of the Rule (1) in FIG. 5, the grade of belonging is expressed by h11. Similarly, the grade of M/P=β0 belonging to "NB" is expressed by a value of the membership function corresponding to M/P=β0; and in the case of the Rule (1) in FIG. 5, the grade of belonging is expressed by h12. In the present embodiment, an ultimate grade h1 to be applied for rule (1) is the smaller value: h11 or h12.

In a preamble processing section 22 of the A correction amount calculation unit 2, a rule corresponding to the above described process, that is, the value ΔG and M/P, is selected, and a grade (e.g. aforementioned h1) at which the selected rule is to be applied is determined. Then in a postamble processing section 23, each coefficient (e.g. a=a1, b=b1) in the postamble of the selected rule is multiplied by the ultimate grade (e.g. h1) at which the rule is to be applied. The foregoing process is called a min-max centroid method.

The aforementioned processing is executed with respect to other rules (2), (4) and (5). In other words, in the examples shown in FIG. 5, a1h1 and b1h1 are obtained for the rule (1), a2h2 and b2h2 for rule (2); a4h4 and b4h4 for rule (4); and a5h5 and b5h5 for rule (5).

A weighted average calculation section 24 in FIG. 2 calculates a0 and b0 respectively in accordance with the following equations.

$$a0 = (a1h1 + a2h2 + a4h4 + a5h5)/(h1 + h2 + h4 + h5)$$

$$b0 = (b1h1 + b2H2 + b4h4 + b5h5)/(h1 + h2 + h4 + h5)$$

Meanwhile, in a centroid calculation section 21, a centroid of a spot formed on the AA sensor 909 is calculated on the basis of the alignment signal AS, and obtains a first alignment amount x for appropriately adjusting a position of the mask 902 and wafer 903 in accordance with the centroid. Note that instead of utilizing the centroid calculation section 21, the first alignment amount calculated by the centroid calculation unit 1 may be utilized.

In an ultimate correction amount calculation section 25, an ultimate correction amount $\Delta AA$ is calculated by the following equation, utilizing the first alignment amount x, the gain a0, and the offset value b0:

$$\Delta AA = a0x + b0$$

In the conventional positioning apparatus, an alignment error of $\pm 0.33\ \mu m$ (peak to peak) is generated. However, in the case where the first alignment amount A is corrected by the correction amount $\Delta AA$ according to the present embodiment, the alignment error is $\pm 0.03\ \mu m$ (peak to peak). Thus, in the present embodiment, the precision of alignment has greatly improved.

Further, according to the present embodiment, it is not necessary to store correction values corresponding to all possible values of $\Delta G$ and M/P; instead, appropriate values (e.g., a0, b0) of only a few typical values of $\Delta G$ and M/P are adjusted by trial and error, and a membership function is defined on the basis of the adjusted values. A correction amount corresponding to an arbitrary value of $\Delta G$ or M/P can be obtained in accordance with the membership function. Accordingly, by virtue of the present invention, the labor necessary for determining a correction amount for any values of $\Delta G$ and M/P can be reduced.

In the present embodiment, descriptions have been provided in a case where the min-max centroid method is utilized to determine a grade of membership for the postamble. To determine the grade for the postamble, for instance, the method of algebraical product-summation-centroid, and the like can be also utilized. Moreover, the grouping based on the shapes of preamble may employ a function-type inference method and fuzzy variables or the like in addition to the simplification method.

Furthermore, in the present embodiment, descriptions have been provided for a case where $\Delta G$ and M/P are utilized as an additional signal which becomes the subject of determination in the preamble; however, the additional signal is not limited to this. Normally, when an alignment mark is formed on a wafer, the wafer is subjected to manufacturing processing such as a heat treatment, deposition or the like, then it is positioned with a mask, and an exposure process is performed on a pattern on the mask. At this stage, the process performed on the wafer may cause the wafer to expand or shrink, or a film covering the alignment mark may cause a change in the amount of light diffracted on the alignment mark. As a result, the precision of measuring the relative amount of positional deviation between the mask and wafer deteriorates. To solve this problem, in the present embodiment, information related to the wafer process, more specifically, the expandability of the wafer or reflectivity of alignment light or the like is inputted as an additional signal, and the above described empirical rule having the membership functions is written and the alignment amount is corrected accordingly, realizing precise alignment.

Figure 10:
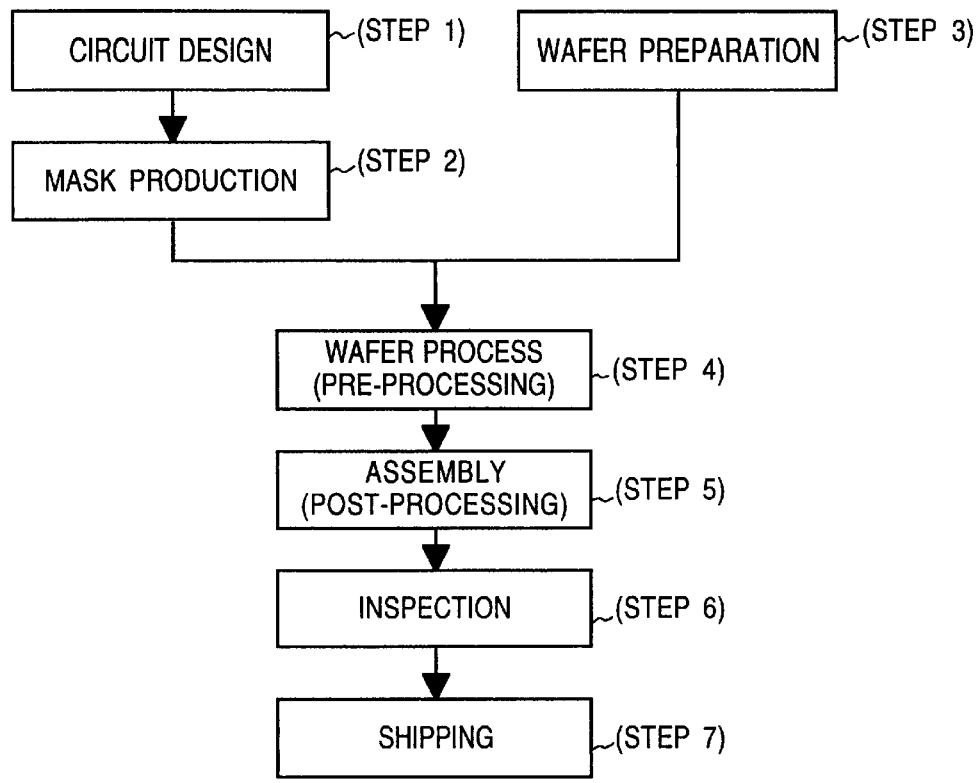
FIG. 10 is a block diagram showing a manufacturing process of a semiconductor device as an example of a manufacturing process of an extremely small device.

Next, an example will be provided for a method of manufacturing a device utilizing the foregoing exposure apparatus. FIG. 10 is a block diagram showing a manufacturing process of a semiconductor device as an example of a manufacturing process of an extremely small device (e.g. semiconductor device such as an IC, an LSI, a liquid crystal panel, a CCD, a film magnetic head, a micro machine or the like).

Step 1 is a step of designing a circuit where a circuit layout pattern of a semiconductor device is designed. In step 2, a mask on which the circuit layout pattern is formed, is generated on the basis of the designed pattern. In step 3, for instance, a wafer is prepared while steps 1 and 2 proceed, utilizing materials such as silicon or the like. Step 4 is called a wafer process, and also called pre-processing. In step 4, multiple layers of patterns are formed on the wafer by a photolithography technique and a device is completed. Step 5 is called a post-processing which includes an assembly process (dicing, bonding or the like) where the manufactured device is made into a chip, and a packaging process (sealing the chip) and the like. Step 6 is an inspection process where an operation confirmation test or a durability test or the like is executed on a completed semiconductor device. A semiconductor device manufactured in the foregoing manner is shipped in step 7.

Figure 11:
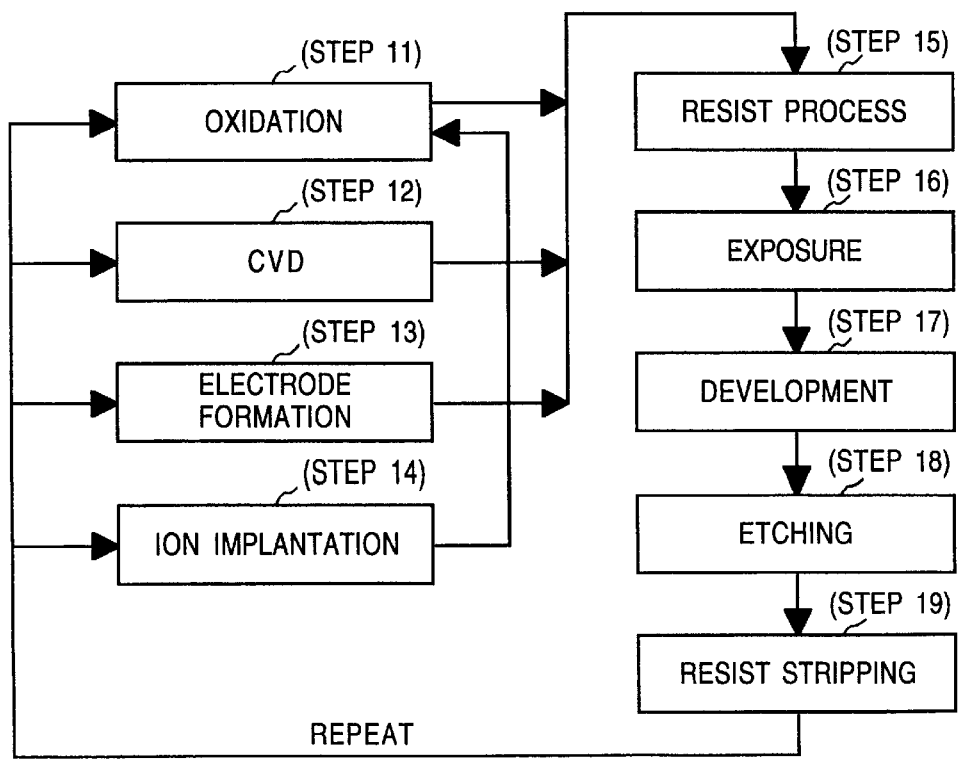
FIG. 11 is a block diagram showing a process of manufacturing a semiconductor device.

FIG. 11 is a block diagram explaining details of step 4 of FIG. 10. In Step 11, an oxidation process is performed for oxidizing the surface of a wafer; in step 12, a CVD process is performed for forming a dielectric layer or a wiring layer; in step 13, a process of forming electrodes is performed; and in step 14, a process of ion implantation is performed. Steps 11–14 are respectively accompanied by the photolithography process steps 15–19. In step 15, a photosensitive material, that is, a resist is coated on the wafer. In step 16, a circuit layout pattern on the mask is exposed on the wafer by the above described exposure apparatus. In step 17, the resist layer on the wafer is developed to form a resist pattern. Next in step 18, the wafer on which the resist pattern is formed is etched. In step 19, the unnecessary resist pattern is stripped.

In the foregoing manufacturing process, patterns are stacked on the wafer and a semiconductor device is formed. Therefore, it is quite important to precisely position each of the layers. By virtue of the exposure apparatus according to the present invention, a highly-integrated semiconductor device which was conventionally difficult to manufacture, can be produced.

As has been described, the positioning apparatus according to the present invention positions a first object and a second object by irradiating a first mark of the first object and a second mark of the second object with a light beam on and detecting the relative positional relation between the two objects on the basis of a plurality of spot images of a light beam formed by the irradiated light beam being reflected or diffracted on the two marks. The positioning apparatus then detects a centroid for each of the plurality of spot images, obtains an alignment amount on the basis of the centroid, and corrects the alignment amount. The correction of the alignment amount is performed in accordance with a parameter, e.g., information related to the first and second objects or information related to the position relation between the light beam and the first mark or the like, belonging to one of a plurality of groups which are grouped by the contents of the parameters.

More particularly, alignment precision can be improved without the necessity of largely improving a signal processing program for controlling the positioning apparatus, by utilizing the fuzzy inference method where the influence caused by parameters each having no independent relationship is written on the basis of an empirical rule, and by controlling the positioning of an XY stage accordingly. There are parameters which causes a deterioration in precise position measurement, however such a relationship with the precise measurement is too complicated to describe. In the present invention, all of such parameters are described according to empirical rules, enabling improvement in precision of position measurement, thereby improving the preciseness of the positioning operation.

Furthermore, according to the present invention, an alignment amount is corrected in all areas where the relative amount of the position deviation between the mask and wafer is measured. Therefore, the position deviation can be measured in all the areas with high precision, making it possible to perform precise positioning in all the areas.

The present invention is not limited to the above embodiments and various changes and modifications can be made within the spirit and scope of the present invention. Therefore, to appraise the public of the scope of the present invention, the following claims are made.

What is claimed is:

1. A positioning apparatus for positioning a first object having a first mark and a second object having a second mark located below the first object, by irradiating the first mark with a light beam and detecting the relative position of the first and second objects on the basis of a spot image of the light beam, formed by the light beam being transmitting through the first mark, or reflected or diffracted upon the first and second marks, said positioning apparatus comprising:

means for detecting the position of the spot image and obtaining an alignment amount on the basis of the detected position;

input means for inputting a plurality of data related to the first and second objects and the light beam;

determination means for determining to which of a plurality of groups each of the data belongs, wherein said groups are categorized by the content of the data and for determining a correction amount of the alignment amount on the basis of the group to which each of the data belongs; and control means for controlling positioning of the first and second objects utilizing the alignment amount whose correction amount has been corrected.

2. The positioning apparatus according to claim 1, wherein a grade of belonging to a related group is obtained for each of said data, and the correction amount is determined on the basis of the grade.

3. The positioning apparatus according to claim 1, wherein said determination means determines the correction amount in accordance with a function where a value determined by the group to which each of said data belongs and the alignment amount are set as variables.

4. The positioning apparatus according to claim 1, wherein said plurality of data includes information associated with a relative positional relation between the first object and the second object, and information associated with a relative positional relation between the light beam and the first mark.

5. The positioning apparatus according to claim 1, wherein the first object is a mask and the second object is a wafer.

6. The positioning apparatus according to claim 5, wherein said plurality of data includes information associated with a semiconductor process performed on the second object which is a wafer.

7. The positioning apparatus according to claim 1, wherein the first and second marks are gratings.

8. A positioning apparatus according to claim 1 in combination with an exposure apparatus.

9. A positioning method of positioning a first object having a first mark and a second object having a second mark located below the first object, by irradiating the first mark with a light beam and detecting the relative position of the first and second objects on the basis of a spot image of the light beam, formed by the light beam being transmitting through the first mark, or reflected or diffracted upon the first and second marks, said method comprising:

a step of detecting the position of the spot image and obtaining an alignment amount on the basis of the detected position;

an input step of inputting a plurality of data related to the first and second objects and the light beam;

a determination step of determining to which of a plurality of groups each of the data belongs, wherein said groups are categorized by the content of the data, and determining a correction amount of the alignment amount on the basis of the group to which each of the data belongs; and a control step of controlling positioning of the first and second objects utilizing the alignment amount whose correction amount has been corrected.

10. The positioning method according to claim 9, further comprising the steps of obtaining a grade of belonging to a related group for each of said data, and determining the correction amount on the basis of the grade.

11. The positioning method according to claim 9, wherein in said determination step, the correction amount is determined in accordance with a function where a value determined by the group to which each of said data belongs and the alignment amount are set as variables.

12. The positioning method according to claim 9, wherein said plurality of data includes information associated with a relative positional relation between the first object and the second object, and information associated with a relative positional relation between the light beam and the first mark.

13. The positioning method according to claim 9, wherein the first object is a mask and the second object is a wafer.

14. The positioning method according to claim 13, wherein said plurality of data includes information associated with a semiconductor process performed on the second object.

15. The positioning method according to claim 9, wherein the first and second marks are gratings.

* * * * *

UNITED STATES PATENT AND TRADEMARK OFFICE
CERTIFICATE OF CORRECTION

PATENT NO. : 5,910,843

DATED : June 8, 1999

INVENTOR(S): SATORU OISHI

It is certified that error appears in the above-identified patent and that said Letters Patent is hereby corrected as shown below:

COLUMN 1,
Line 27, "beam 601." should read --beam 607.--;
Line 46, "change;" should read --change,--;
Line 63, "phenomena" should read --phenomenon--; and
Line 64, "factors e.g." should read --factors, e.g.,--.

COLUMN 2,
Line 18, "simple a" should read --a simple--.

COLUMN 3,
Line 53, "AA mark aa" should read --a mark on a--.

COLUMN 4,
Line 4, "EMBODIMENT" should read --EMBODIMENTS--; and
Line 56, "an" should read --a--.

COLUMN 6,
Line 1, "rule" (2nd occurrence) should read --rules--.
Line 43, "($\beta1<\beta0<\beta2$)" should read --($\beta1<\beta0<\beta2$).--; and
Line 65, "A" should be deleted.

COLUMN 7,
Line 17, "b2H2" should read --b2h2--.

UNITED STATES PATENT AND TRADEMARK OFFICE
CERTIFICATE OF CORRECTION

PATENT NO. : 5,910,843

DATED : June 8, 1999

INVENTOR(S): SATORU OISHI

It is certified that error appears in the above-identified patent and that said Letters Patent is hereby corrected as shown below:

COLUMN 8,
Line 64, "on" should be deleted.

COLUMN 9,
Line 18, "causes" should read --cause--; and
Line 42, "transmitting" should read --transmitted--.

COLUMN 10,
Line 25, "transmitting" should read --transmitted--.

Signed and Sealed this

Twenty-seventh Day of June, 2000

Attest:

Q. TODD DICKINSON

Attesting Officer

Director of Patents and Trademarks